US011747980B1

(12) United States Patent
Bhattacharjee et al.

(10) Patent No.: US 11,747,980 B1
(45) Date of Patent: Sep. 5, 2023

(54) DECOMPRESSION OF A FILE

(71) Applicant: International Business Machines Corporation, Armonk, NY (US)

(72) Inventors: Deepankar Bhattacharjee, Bangalore (IN); Girish Gopala Kurup, Jagadishnagar (IN); Bulent Abali, Tenafly, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/664,059

(22) Filed: May 19, 2022

(51) Int. Cl.
*G06F 3/06* (2006.01)
*H03M 7/30* (2006.01)

(52) U.S. Cl.
CPC ........ *G06F 3/0608* (2013.01); *H03M 7/6005* (2013.01); *H03M 7/6029* (2013.01); *G06F 3/0656* (2013.01)

(58) Field of Classification Search
CPC .................................................... H03M 7/30
See application file for complete search history.

(56) References Cited

U.S. PATENT DOCUMENTS

| | | | | |
|---|---|---|---|---|
| 5,768,561 A | * | 6/1998 | Wise | H04L 65/70 |
| | | | | 712/15 |
| 5,978,592 A | * | 11/1999 | Wise | G06F 13/28 |
| | | | | 375/240.2 |
| 6,112,017 A | * | 8/2000 | Wise | G06F 12/0607 |
| | | | | 711/E12.003 |
| 6,330,665 B1 | * | 12/2001 | Wise | G06F 12/0207 |
| | | | | 711/E12.003 |
| 9,917,597 B1 | * | 3/2018 | Cutter | H03M 7/6029 |
| 2018/0152202 A1 | | 5/2018 | Gopal et al. | |
| 2020/0167224 A1 | * | 5/2020 | Abali | G06F 11/0721 |
| 2020/0249948 A1 | | 8/2020 | Giamei et al. | |
| 2020/0293377 A1 | | 9/2020 | Slegel et al. | |

FOREIGN PATENT DOCUMENTS

WO 2020106626 A1 5/2020

* cited by examiner

*Primary Examiner* — Lam T Mai
(74) *Attorney, Agent, or Firm* — Cantor Colburn LLP; Nathan Rau

(57) ABSTRACT

Embodiments include performing decompression of a file. Aspects include receiving a compressed input stream for the file and processing the compressed input stream, by two or more pipelines in parallel, to create an output vector, wherein each pipeline includes a first decoder and a second decoder. Aspects also include writing, by each of the two or more pipelines, entries onto a scratchpad in an order defined by the output vector and writing one or more entries from the scratchpad to a main history buffer based on a determination that a validity field of the one or more entries has a value of true.

20 Claims, 6 Drawing Sheets

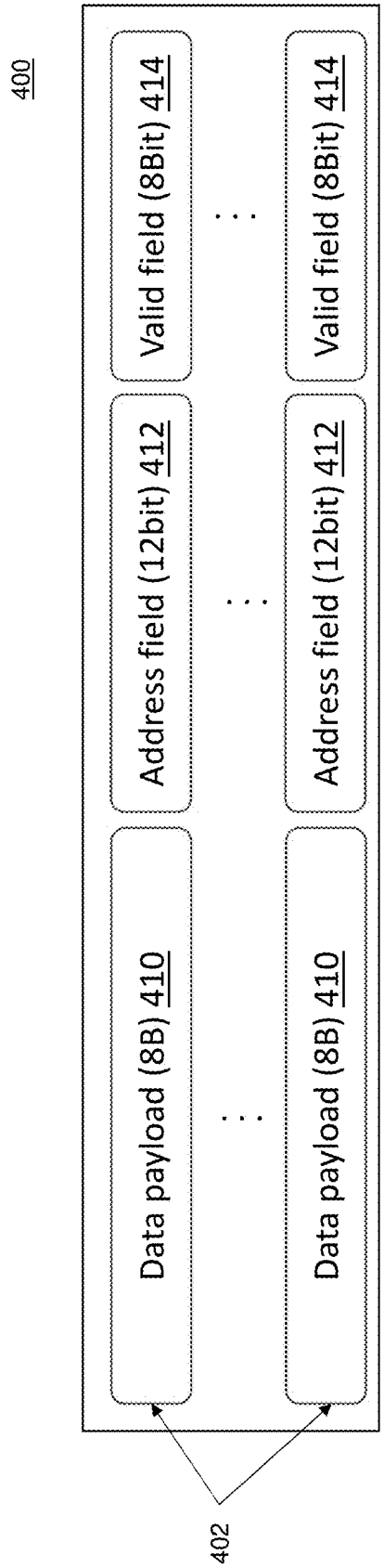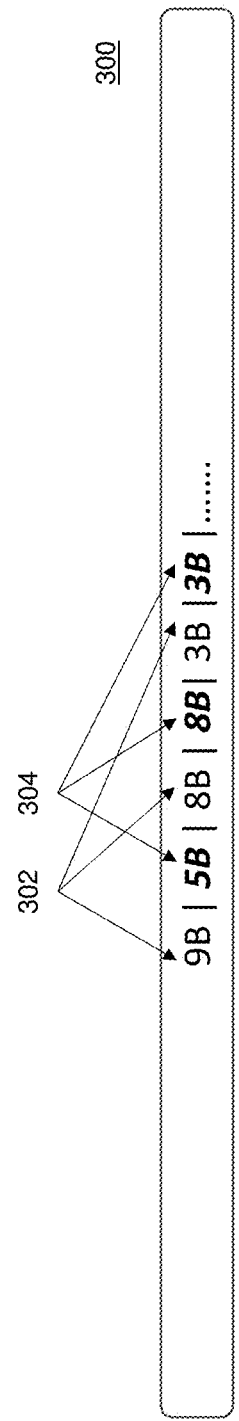
FIG. 4
FIG. 3

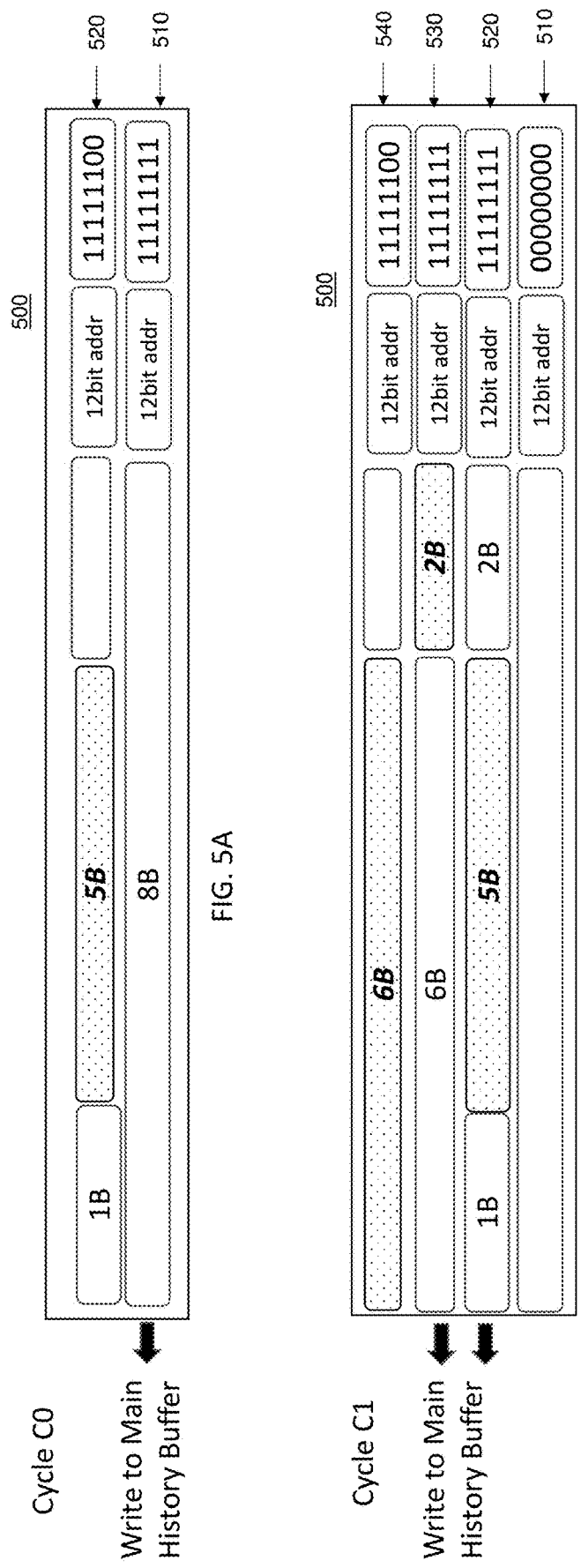

US 11,747,980 B1

DECOMPRESSION OF A FILE

BACKGROUND

The present invention generally relates to computer technology, and more specifically, to improving the performance of decompression of a file.

Modern computer systems often utilize complex algorithms to compress files for storage and transmission. One such algorithm is the deflate algorithm which is used for gzip file compression. Traditional decompression of a gzip file requires a two-step process with the input of the second step being dependent on the output of the first step. In addition, the second step of the decompression process requires a read/write of a memory. As a result, the decompression of a gzip file is performed using a single processing pipeline, which limits the speed at which a gzip file can be decompressed.

SUMMARY

Embodiments of the present invention are directed to a computer-implemented method for performing decompression of a file. A non-limiting example of the computer-implemented method includes receiving a compressed input stream for the file and processing the compressed input stream, by two or more pipelines in parallel, to create an output vector, wherein each pipeline includes a first decoder and a second decoder. Aspects also include writing, by each of the two or more pipelines, entries onto a scratchpad in an order defined by the output vector and writing one or more entries from the scratchpad to a main history buffer based on a determination that a validity field of the one or more entries has a value of true.

Embodiments of the present invention are directed to a system for performing decompression of a file. The system includes a memory having computer readable instructions and one or more processors for executing the computer readable instructions, the computer readable instructions controlling the one or more processors to perform operations including receiving a compressed input stream for the file and processing the compressed input stream, by two or more pipelines in parallel, to create an output vector, wherein each pipeline includes a first decoder and a second decoder. The operations also include writing, by each of the two or more pipelines, entries onto a scratchpad in an order defined by the output vector and writing one or more entries from the scratchpad to a main history buffer based on a determination that a validity field of the one or more entries has a value of true.

Embodiments of the present invention are directed to a computer readable storage medium having program instructions embodied therewith, the program instructions executable by a processor to cause the processor to perform operations including receiving a compressed input stream for the file and processing the compressed input stream, by two or more pipelines in parallel, to create an output vector, wherein each pipeline includes a first decoder and a second decoder. The operations also include writing, by each of the two or more pipelines, entries onto a scratchpad in an order defined by the output vector and writing one or more entries from the scratchpad to a main history buffer based on a determination that a validity field of the one or more entries has a value of true.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 is a block diagram illustrating an output vector for use in the decompression of a file in accordance with one or more embodiments of the present invention;

FIG. 4 is a block diagram illustrating a scratchpad for use in the decompression of a file in accordance with one or more embodiments of the present invention;

FIGS. 5A, 5B, and 5C are block diagrams illustrating the use of a scratchpad during the decompression of a file in accordance with one or more embodiments of the present invention;

DETAILED DESCRIPTION

One or more embodiments of the invention include methods, systems, and computer program products for improving the speed of the decompression of a file. In exemplary embodiments, a compressed file, such as a gzip file, is received and processed by two or more processing pipelines in parallel. The processing pipelines are configured to write their output to a temporary storage, referred to herein as a scratchpad. The data stored on the scratchpad is then written to a main history buffer and untimely to a target output file. In exemplary embodiments, the scratchpad is configured to ensure that the output of the two or more pipelines are written to the main history buffer in the correct order.

In exemplary embodiments, the main history buffer is divided into a plurality of blocks of memory that are each able to be read from and written to simultaneously. In one embodiment, the main history buffer has a size of thirty-two kilobytes (KB) and includes sixteen different two-kilobyte (KB) memory blocks. In another embodiment, the main history buffer has a size of thirty-two kilobytes (KB) and is includes thirty-two different one-kilobyte (KB) memory blocks. In exemplary embodiments, the read/write addresses of the plurality of blocks are indexed using the least significant bit(s).

Figure 1:
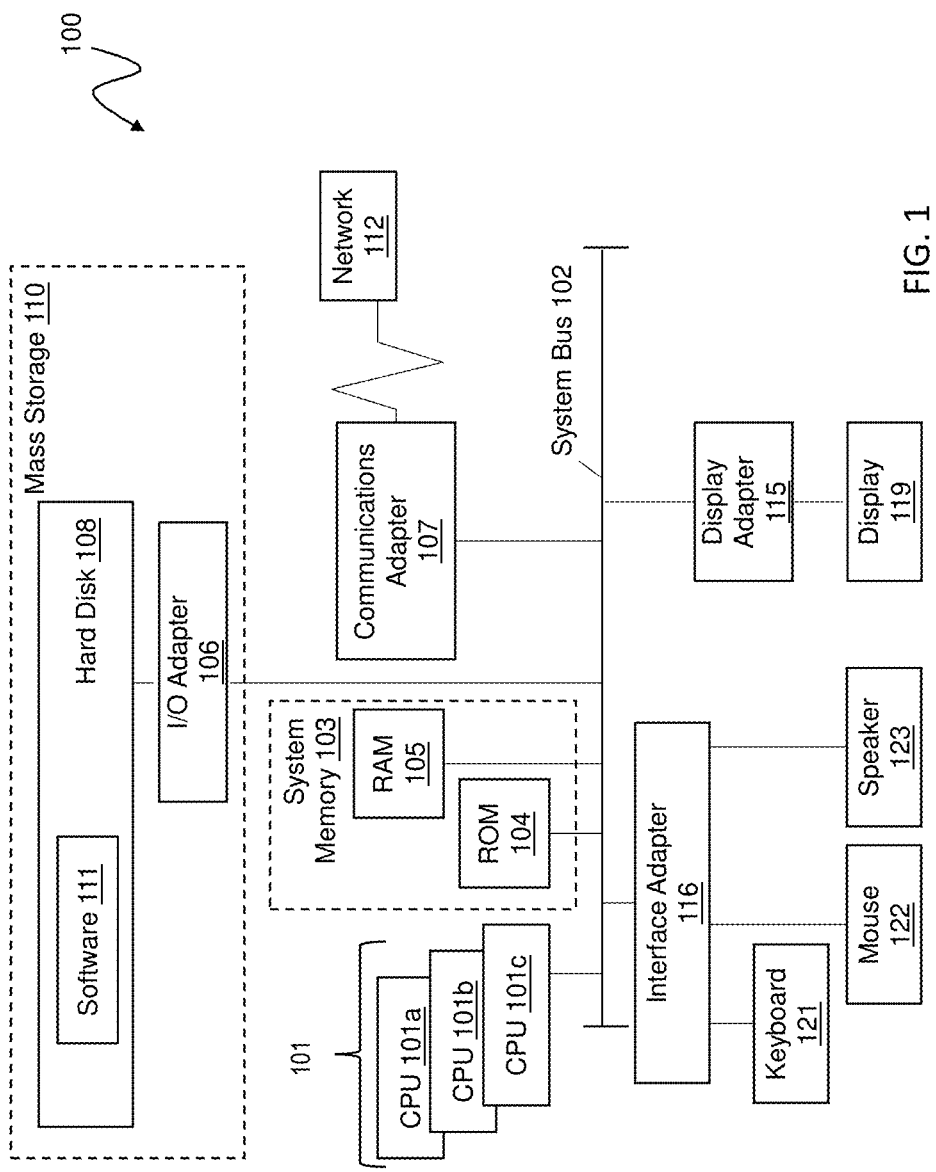
FIG. 1 depicts a block diagram of an example computer system for use in conjunction with one or more embodiments of the present invention.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
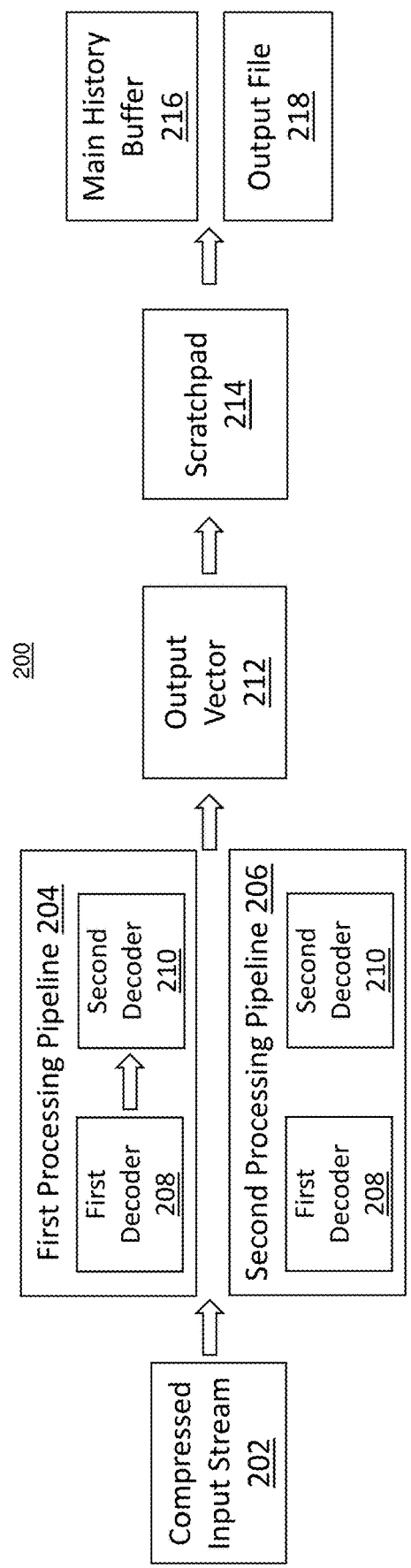
FIG. 2 is a block diagram of a system for decompression of a file in accordance with one or more embodiments of the present invention.

Referring now to FIG. 2 a block diagram of a system 200 for decompression of a file in accordance with one or more embodiments of the present invention is shown. The processing pipelines 204, 206 shown in FIG. 2 may be used in and/or integrated into computer system 100, shown in FIG. 1. As illustrated, the system 200 includes a compressed input stream 202 which is provided to both a first processing pipeline 204 and a second processing pipeline 206. Each of the first processing pipeline 204 and the second processing pipeline 206 include a first decoder 208 and a second decoder 210 that are used to decompress and decode the compressed input stream 202.

In exemplary embodiments, the first decoder 208 is a Huffman decoder that is configured to receive the compressed input stream 202 and output a stream of length-distance symbols, where each length-distance symbol includes a byte offset (how far to go back in a main history buffer) and a string length at that reference location in the main history buffer. Next, the stream of length-distance symbols is provided to the second decoder 210. The second decoders 210 are configured to decode the length-distance symbols and to create an output vector 212, which is described in more detail with reference to FIG. 3. In exemplary embodiments, data from the scratchpad 214 that is in flight to the main history buffer 216, can be read from by the processing pipelines 204, 206 if the index address match.

In exemplary embodiments, the first processing pipeline 204 and the second processing pipeline 206 are further configured to write decompressed data, in the order determined by the output vector 212, to the scratchpad 214, which is described in more detail with reference to FIG. 4. In exemplary embodiments, the decompressed data is written to the scratchpad 214 in entries that include a chunk of data that has a fixed size, such as eight bytes. Once an entire entry is filed with data and the entry is marked as valid, the data from the entry is written to the main history buffer 216, which is described in more detail with reference to FIG. 6. In one embodiment, the main history buffer 216 stores the data from the entries in a first-in-first-out manner. In exemplary embodiments, data is written to and from the main history buffer in chunks of data that are the fixed size of the entries in the scratchpad 214.

Referring now to FIG. 3 a block diagram of an output vector 300 for use in decompression of a file in accordance with one or more embodiments of the present invention is shown. As illustrated, the output vector 300 includes a plurality of entries 302, 304. In one embodiment, the output vector 300 includes a first set of entries 302 that are placed in the output vector 300 by a first processing pipeline and a second set of entries 304 that are placed in the output vector 300 by a second processing pipeline. In exemplary embodiments, each entry corresponds to a decoded length-distance symbol and each entry 302, 304 indicates the string length associated with the decoded length-distance symbol. In exemplary embodiments, the number of the sets of entries in the output vector 300 is equal to the number of processing pipelines used in the decompression system.

Referring now to FIG. 4 a block diagram of a scratchpad 400 for use in decompression of a file in accordance with one or more embodiments of the present invention is shown. As illustrated, the scratchpad 400 includes a plurality of entries 402, which each include a data payload 410, an address field 412, and a validity field 414. In exemplary embodiments, the number of entries in the scratchpad 400 is twice the number of processing pipelines used in the decompression system.

Figure 5C:
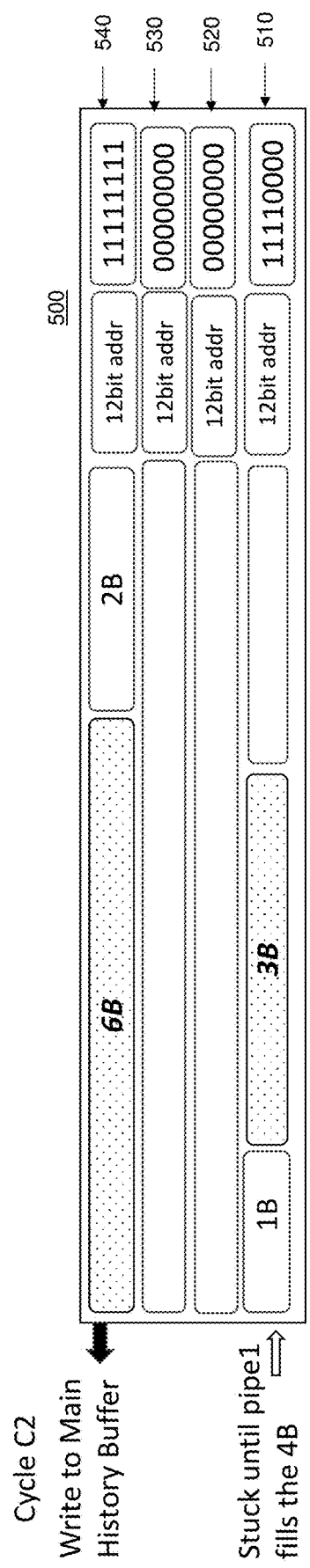

Referring now to FIGS. 5A, 5B, and 5C block diagrams illustrating the use of a scratchpad 500 for the output vector shown in FIG. 3 is shown. As shown in FIG. 3, the first entry 302 in the output vector 300 includes a string length of 9 bytes (B). As best illustrated in FIG. 5A, during a first clock cycle (C0), the first entry 302 of the output vector 300 is written across a first entry 510 and a second entry 520 of the scratchpad 500 by the first processing pipeline. Also during the first clock cycle, the second entry 304 in the output vector 300, which has a string length of 5B is written to second entry 520 of the scratchpad 500 by the second processing pipeline. Since the first entry 510 is full of valid data, i.e., the validity field of the first entry is 11111111, the first entry 510 is written to the main history buffer and the output file. The validity field of the second entry 520 has a value of 11111100, which indicates that only 6B of the 8B entry have valid data.

During a second clock cycle (C1), the third entry 302 of the output vector 300, which is 8B, is written across the second entry 520 and a third entry 530 of the scratchpad 500 by the first processing pipeline. Also during the second clock cycle, the fourth entry 304 in the output vector 300, which has a string length of 8B is written across the third entry 530 and a fourth entry 540 of the scratchpad 500 by the second processing pipeline. Since the second entry 520 and third entry 530 are both full of valid data, i.e., the validity field of the entries is 11111111, both the second entry 520 and third entry 530 can be written to the main history buffer. The validity field of the fourth entry 540 has a value of 11111100, which indicates that only 6B of the 8B entry have valid data.

During a third clock cycle (C2), the fifth entry 302 of the output vector 300, which is 3B, is written across the fourth entry 540 and a first entry 510 of the scratchpad 500 by the first processing pipeline. Also during the third clock cycle, the sixth entry 304 in the output vector 300, which has a string length of 3B is written to the first entry 510 of the scratchpad 500 by the second processing pipeline. Since the fourth entry 540 is full of valid data, i.e., the validity field of the first entry is 11111111, the fourth entry 540 is written to the main history buffer. The validity field of the first entry 510 has a value of 11110000, which indicates that only 4B of the 8B entry have valid data.

Figure 6:
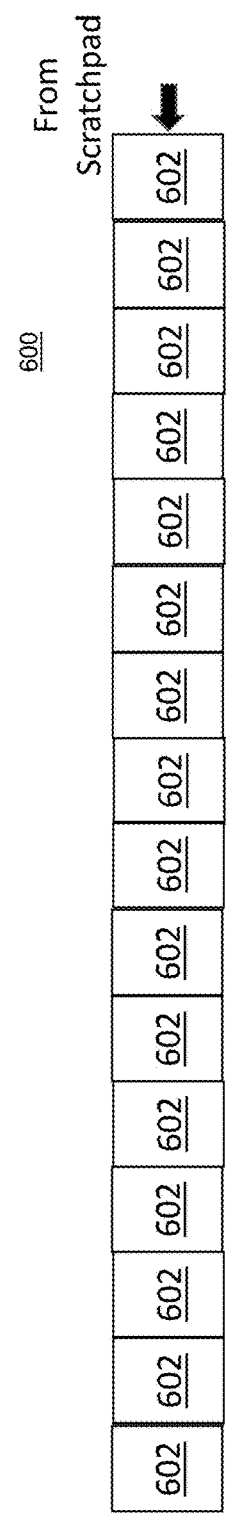
FIG. 6 is a block diagram illustrating a main history buffer for use in the decompression of a file in accordance with one or more embodiments of the present invention.

Referring now to FIG. 6 a block diagram of a main history buffer 600 in accordance with one or more embodiments of the present invention is shown. As illustrated, the main history buffer 600 includes a plurality of memory blocks 602 that are each able to be read from and written to simultaneously. In the embodiment shown, the main history buffer has a size of thirty-two kilobits (KB) and each of the sixteen memory blocks 602 has a size of two-hundred-and-fifty-six-byte memory blocks. The main history buffer 600 stores the data received from the scratchpad in a first-in-first-out manner. In exemplary embodiments, the data that is sent to the main history buffer 600 is also sent to an output file in parallel.

Figure 7:
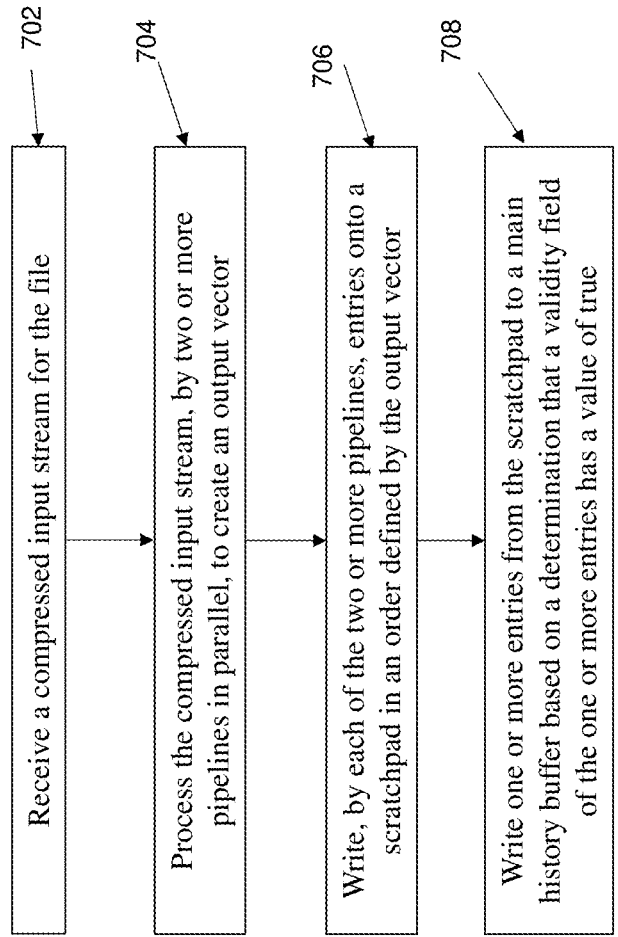
FIG. 7 is a flowchart of a method for performing decompression of a file in accordance with one or more embodiments of the present invention.

Referring now to FIG. 7 a flowchart of a method 700 for performing decompression of a file in accordance with one or more embodiments of the present invention is shown. The method 700 includes receiving a compressed input stream for the file, as shown at block 702. In one embodiment, the file is in a gzip file format. Next, as shown at block 704, the method 700 includes processing the compressed input stream, by two or more pipelines in parallel, to create an output vector. In exemplary embodiments, each pipeline includes a first decoder and a second decoder. In one embodiment, the first decoder is a Huffman decoder that outputs a length-distance symbol and the second decoder is a length-distance decoder configured to process the length-distance symbol by accessing the main history buffer.

Next, as shown at block 706, the method 700 includes writing, by each of the two or more pipelines, entries onto a scratchpad in an order defined by the output vector. In exemplary embodiments, each entry in scratchpad includes a data entry of a fixed size, an address field, and the valid field. In one embodiment, the scratchpad is made using a plurality of latches, which enable simultaneous reads/writes from multiple entries of the scratchpad. The method 700 also includes writing one or more entries from the scratchpad to a main history buffer based on a determination that a validity field of the one or more entries has a value of true, as shown at block 708. In exemplary embodiments, the main history buffer is a thirty-two-kilobyte memory split into a plurality of indexed memory blocks that are separately accessible.

In exemplary embodiments, the use of two or more processing pipelines to decompress a file will reduce the time required to decompress the file and increase the performance of the computer performing the decompression.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for performing decompression of a file, the method comprising:
   receiving a compressed input stream for the file;
   processing the compressed input stream, by two or more pipelines in parallel, to create an output vector, wherein each pipeline includes a first decoder and a second decoder;
   writing, by each of the two or more pipelines, entries onto a scratchpad in an order defined by the output vector; and
   writing one or more entries from the scratchpad to a main history buffer based on a determination that a validity field of the one or more entries has a value of true.

2. The computer-implemented method of claim 1, wherein the first decoder is a Huffman decoder that outputs a length-distance symbol.

3. The computer-implemented method of claim 2, wherein the second decoder is a length-distance decoder configured to process the length-distance symbol by accessing the main history buffer.

4. The computer-implemented method of claim 1, wherein the main history buffer is a thirty-two-kilobyte memory split into a plurality of indexed memory blocks that are separately accessible.

5. The computer-implemented method of claim 1, wherein each entry in scratchpad includes a data entry of a fixed size, an address field, and the valid field.

6. The computer-implemented method of claim 1, wherein the scratchpad is made using a plurality of latches.

7. The computer-implemented method of claim 1, further comprising:
  writing the one or more entries from the scratchpad to a target output file,
  wherein writing data to the main history buffer and to the target output file is performed in blocks of data having a fixed size equal to a size of a data entry in the scratchpad.

8. A system comprising:
  a memory having computer readable instructions; and
  one or more processors for executing the computer readable instructions, the computer readable instructions controlling the one or more processors to perform operations comprising:
  receiving a compressed input stream for the file;
  processing the compressed input stream, by two or more pipelines in parallel, to create an output vector, wherein each pipeline includes a first decoder and a second decoder;
  writing, by each of the two or more pipelines, entries onto a scratchpad in an order defined by the output vector; and
  writing one or more entries from the scratchpad to a main history buffer based on a determination that a validity field of the one or more entries has a value of true.

9. The system of claim 8, wherein the first decoder is a Huffman decoder that outputs a length-distance symbol.

10. The system of claim 9, wherein the second decoder is a length-distance decoder configured to process the length-distance symbol by accessing the main history buffer.

11. The system of claim 8, wherein the main history buffer is a thirty-two-kilobyte memory split into a plurality of indexed memory blocks that are separately accessible.

12. The system of claim 8, wherein each entry in scratchpad includes a data entry of a fixed size, an address field, and the valid field.

13. The system of claim 8, wherein the scratchpad is made using a plurality of latches.

14. The system of claim 8, wherein the operations further comprise:
  writing the one or more entries from the scratchpad to a target output file,
  wherein writing data to the main history buffer and to the target output file is performed in blocks of data having a fixed size equal to a size of a data entry in the scratchpad.

15. A computer program product comprising a computer readable storage medium having program instructions embodied therewith, the program instructions executable by a processor to cause the processor to perform operations comprising:
  receiving a compressed input stream for the file;
  processing the compressed input stream, by two or more pipelines in parallel, to create an output vector, wherein each pipeline includes a first decoder and a second decoder;
  writing, by each of the two or more pipelines, entries onto a scratchpad in an order defined by the output vector; and
  writing one or more entries from the scratchpad to a main history buffer based on a determination that a validity field of the one or more entries has a value of true.

16. The computer program product of claim 15, wherein the first decoder is a Huffman decoder that outputs a length-distance symbol.

17. The computer program product of claim 16, wherein the second decoder is a length-distance decoder configured to process the length-distance symbol by accessing the main history buffer.

18. The computer program product of claim 15, wherein the main history buffer is a thirty-two-kilobyte memory split into a plurality of indexed memory blocks that are separately accessible.

19. The computer program product of claim 15, wherein each entry in scratchpad includes a data entry of a fixed size, an address field, and the valid field.

20. The computer program product of claim 15, wherein the operations further comprise:
  writing the one or more entries from the scratchpad to a target output file,
  wherein writing data to the main history buffer and to the target output file is performed in blocks of data having a fixed size equal to a size of a data entry in the scratchpad.

* * * * *